US008832622B1

(12) United States Patent
Xu et al.

(10) Patent No.: US 8,832,622 B1
(45) Date of Patent: Sep. 9, 2014

(54) COVERAGE SCOREBOARD

(71) Applicant: Marvell International Ltd., Hamilton (BM)

(72) Inventors: Yang Xu, San Jose, CA (US); Bharat Baliga-Savel, San Jose, CA (US)

(73) Assignee: Marvell International Ltd., Hamilton (BM)

( * ) Notice: Subject to any disclaimer, the term of this patent is extended or adjusted under 35 U.S.C. 154(b) by 0 days.

(21) Appl. No.: 13/675,555

(22) Filed: Nov. 13, 2012

Related U.S. Application Data

(60) Provisional application No. 61/563,406, filed on Nov. 23, 2011.

(51) Int. Cl.
*G06F 9/455* (2006.01)
*G06F 17/50* (2006.01)

(52) U.S. Cl.
CPC .................................. *G06F 17/5081* (2013.01)
USPC ............ 716/112; 716/106; 716/111; 716/136

(58) Field of Classification Search
CPC . G06F 17/5022; G06F 11/263; G06F 17/504; G06F 11/261; G06F 17/5081; G06F 2217/86; G06F 11/22; G06F 11/2215; G06F 11/3676; G06F 11/3684; G06F 2201/86; G06F 2217/14; G01R 31/318307; G01R 31/318342; G01R 31/318385
USPC ......................................... 716/106–115, 136
See application file for complete search history.

(56) References Cited

U.S. PATENT DOCUMENTS

| | | | | |
|---|---|---|---|---|
| 7,472,361 | B2 * | 12/2008 | Watanabe et al. | 716/103 |
| 8,132,135 | B2 * | 3/2012 | Khoo et al. | 716/107 |
| 8,160,861 | B2 * | 4/2012 | Ford et al. | 703/21 |
| 8,448,112 | B1 * | 5/2013 | Kashai et al. | 716/109 |
| 2008/0120085 | A1 * | 5/2008 | Alexanian et al. | 703/14 |
| 2008/0163143 | A1 * | 7/2008 | Kwon | 716/5 |
| 2009/0115443 | A1 * | 5/2009 | Lai et al. | 324/765 |
| 2009/0204932 | A1 * | 8/2009 | Bormann et al. | 716/5 |
| 2010/0082315 | A1 * | 4/2010 | Hall | 703/13 |
| 2011/0238397 | A1 * | 9/2011 | Chen et al. | 703/13 |
| 2011/0307847 | A1 * | 12/2011 | Liao et al. | 716/103 |
| 2012/0005640 | A1 * | 1/2012 | Mehta | 716/106 |
| 2012/0227021 | A1 * | 9/2012 | Huilgol | 716/106 |
| 2013/0074019 | A1 * | 3/2013 | Mehta | 716/106 |

OTHER PUBLICATIONS

Accellera Organization, Napa, California, Universal Verification Methodology (UVM) 1.0 User's Guide, Feb. 23, 2011.
Accellera Organization, Napa, California, Universal Verification Methodology (UVM) 1.0 Class Reference, Feb. 2011.
Accellera Organization, Inc., Napa, California, SystemVerilog 3.1a Language Reference Manual, Accellera's Extensions to Verilog®, May 13, 2004.

* cited by examiner

*Primary Examiner* — Nha Nguyen

(57) ABSTRACT

A method includes receiving an output response from a design under test (DUT) in response to an input applied to the DUT according to a test, comparing the output response with a reference response of the test to determine a pass/fail of the DUT for the test, and collecting the test into a verification coverage when the DUT passes the test.

14 Claims, 4 Drawing Sheets

```
1  class usb2_sb #(type T1, type T2) extends mv1_scoreboard;
2  `uvm_component_params_utils(usb2_sb #(T1, T2))
3  typedef usb2_sb #(T1, T2) THIS_CLASS;
4  typedef mv1_ahb_trans #(T1) AHB_TT;
5  uvm_analysis_imp_abh_s_rdXact #(AHB_TT, THIS_CLASS)
6                                              ahb_s_rdXact_imp;
7  .......
8  virtual function void compare_data(T1 exp_, T1 act_);
9     if(exp_.Id != act_.Id)
10 ........
11 endfunction : compare_data
12
13 endfunction : usb2_sb
```

FIG. 4

```
1  class usb2_cov_sb #(type T1, T2) extends usb2_sb #(T1, T2);
2   `uvm_component_params_utils(usb2_cov_sb #(T1, T2))
3   typedef usb2_cov_sb #(T1, T2) THIS_CLASS;
4   ahb_cov ahb_cov_inst;
5   ......
6   virtual function void compare_data(T1 exp_, T1 act_);
7    super.compare_data(exp_, act_);
8    ahb_cov_inst.get_sample_data(act_);
9    ahb_cov_inst.ahb_cov_grp.sample();
10  endfunction : compare_data
11
12 endclass : usb2_cov_sb
```

FIG. 5

COVERAGE SCOREBOARD

INCORPORATION BY REFERENCE

This present disclosure claims the benefit of U.S. Provisional Application No. 61/563,406, "Coverage Scoreboard" filed on Nov. 23, 2011, which is incorporated herein by reference in its entirety.

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

Generally, an integrated circuit (IC) design process includes a verification step to verify a circuit design. The verification step is typically performed by applying one or more test files to the circuit design and a reference model. Then, the outputs from the circuit design and the reference model are compared and analyzed to verify correctness of the circuit design. The quality and thoroughness of the verification is measured by coverage.

SUMMARY

Aspects of the disclosure provide a method. The method includes receiving an output response from a design under test (DUT) in response to an input applied to the DUT according to a test, comparing the output response with a reference response of the test to determine a pass/fail of the DUT for the test, and collecting the test into a verification coverage when the DUT passes the test.

In an embodiment, the method includes avoiding collecting the test into the verification coverage without the comparison, and avoiding collecting the test into the verification coverage when the comparison does not succeed.

According to an aspect of the disclosure, the method includes receiving the output response from a single port, and using the output response received from the single port for both the comparison and the coverage collection. In an example, the method includes converting pin level signals in and out of the DUT to transaction level signals, and providing the transaction level signals to a class defined in an objective oriented programming language via the single port. For example, the method includes providing the transaction level signals to the class that defines functions for the coverage collection and inherits functions of a functional scoreboard from a parent class. The method further includes modifying the functions for the coverage collection in the class without affecting the parent class.

Aspects of the disclosure provide a verification system. The verification system includes a scoreboard component. The scoreboard component is configured to receive an output response from a design under test (DUT) in response to an input applied to the DUT according to a test, compare the output response with a reference response of the test to determine a pass/fail of the DUT for the test, and collect the test into a verification coverage when the DUT passes the test.

Aspects of the disclosure also provide a non-transitory computer-readable storage medium storing instructions for causing a processor to execute operations for design verification. The operations include receiving an output response from a design under test (DUT) in response to an input applied to the DUT according to a test, comparing the output response with a reference response of the test to determine a pass/fail of the DUT for the test, and collecting the test into a verification coverage when the DUT passes the test.

BRIEF DESCRIPTION OF THE DRAWINGS

Various embodiments of this disclosure that are proposed as examples will be described in detail with reference to the following figures, wherein like numerals reference like elements, and wherein:

FIG. 4 shows a code example 400 for a functional scoreboard; and

FIG. 5 shows a code example 500 for a coverage scoreboard according to an embodiment of the disclosure.

DETAILED DESCRIPTION OF EMBODIMENTS

Figure 1:
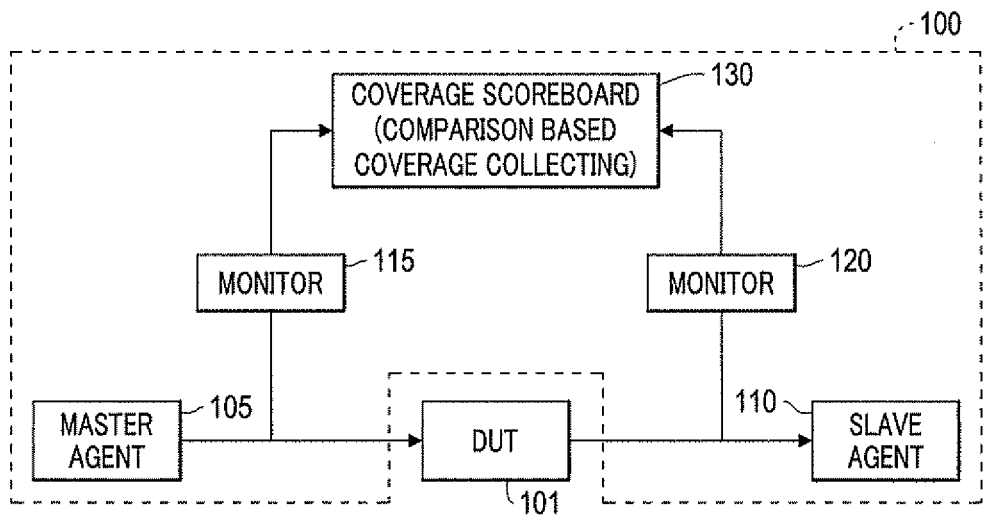
FIG. 1 shows a block diagram of a verification system example according to an embodiment of the disclosure.

FIG. 1 shows a block diagram of a verification system example 100 according to an embodiment of the disclosure. The verification system 100 is used to verify circuit designs, such as a design under test (DUT) 101. The verification system 100 includes a master agent 105, a slave agent 110, monitors 115 and 120, and a coverage scoreboard 130. The coverage scoreboard 130 collects a test into a coverage metric based on a comparison of the DUT 101 outputs in response to the test with a reference. These elements are coupled together as shown in FIG. 1.

According to an embodiment of the disclosure, the DUT 101 is a design for an integrated circuit at a relatively low abstraction level, such as at a register-transfer level (RTL), at a gate level, at a transistor level, and the like. The DUT 101 defines, at the relatively low abstraction level, internal components of the integrated circuit, and interfaces of the internal components to external components that are outside of the DUT 101. Thus, generally, the interfaces of the DUT 101 use low abstraction level signals for communication with the external components. In an example, the interfaces of the DUT 101 include a plurality of pins configured to receive or transmit pin level signals, such as a binary bit signal that changes bit value over time.

The verification system 100 suitably interfaces with the DUT 101, provides tests to the DUT 101, monitors inputs and outputs of the DUT 101 in response to the tests, compares output responses of the DUT 101 to a reference, and collects the tests into the coverage metric based on the comparisons.

According to an aspect of the disclosure, the verification system 100 is implemented as one or more processors executing software instructions. In an example, the DUT 101 is implemented as RTL codes stored in a memory. The verification system 100 includes a simulator implemented by a processor executing simulation software. The RTL codes are then imported into the simulator to simulate the operations of the DUT 101.

Further, the verification system 100 includes verification software codes, such as verification intellectual property (IP) software, and the like, to be executed by one or more processor to perform various components in the verification system 100, such as the master agent 105, the slave agent 110, the monitors 115 and 120, and the coverage scoreboard 130. In an example, the verification system 100 is implemented using an object oriented programming language. The components in the verification system 100 can be implemented as classes in the object oriented programming language. The verification IP software provides reusable classes. The verification system 100 can use the reusable classes, and can create new classes with additional features based on the reusable classes.

In an embodiment, the master agent 105 is configured to receive a test from a memory (not shown) or a test generator (not shown), drives a stimulus, such as input signals at the pin level, to the DUT 101 according to the test. The DUT 101 operates in response to the stimulus, and generates an output response, such as output signals at the pin level. The slave agent 110 receives the output signals at the pin level from the DUT 101. In an example, the slave agent 110 may also provide return signals, such as acknowledge (ACK) signals in a network device scenario, and the like, to the DUT 101 based on the received output signals.

Further, in an embodiment, the monitors 115 and 120 watch the pin level signals communicated between the master agent 105 and the DUT 101, and communicated between the DUT 101 and the slave agent 110, convert the pin level signals of low abstraction level into high abstraction level signals, such as transaction level signals, and provide the transaction level signals to the coverage scoreboard 130. In an example, the monitors 115 and 120 sample the pin level signals based on a clock, and assemble the sampled signals into transaction level signals that do not depend on the clock, such a data structure, and the like. The data structure can be communicated to a class, such as a coverage scoreboard class, in the object oriented programming language, via a port of the class.

According to an aspect of the disclosure, the coverage scoreboard 130 integrates functionalities of both a functional scoreboard and a coverage collector into a single module, such as a single class in the object oriented programming language. The coverage scoreboard 130 receives the transaction level signals from the monitors 115 and 120. Then, in an example, the functionality of both the functional scoreboard and the coverage collector are performed based on the received transaction level signals, and thus connectivity efforts can be saved.

In an example, the DUT 101 is a design for a system on chip (SOC) that includes multiple interfaces, such as a universal serial bus (USB) circuit, a peripheral component interconnect express (PCIe) circuit, and the like. The DUT 101 uses a switch fabric to provide communication among the multiple interfaces and other circuit components, such as a central processing unit (CPU), a memory circuit, a memory controller, and the like. The monitors 115 and 120 monitor the pin level signals at the multiple interfaces, such as the USB circuit and the PCIe circuit, and convert the pin level signals to transaction level signals, and provide the transaction level signals to the coverage scoreboard 130 for use in both the functional scoreboard and the coverage collector.

In a comparison example, the functional scoreboard and the coverage collector are separate modules that communicate with the monitors 115 and 120 in parallel. The monitors 115 and 120 respectively provide the transaction level signals to the separate modules. The comparison example requires additional effort for setting up the connectivity between the coverage collector and the monitors 115 and 120 and the connectivity between the functional scoreboard and the monitors 115 and 120. For example, the monitor 115 and 120 need to set up paths for the functional scoreboard to monitor the multiple interfaces of the SOC, and additional paths for the coverage collector to monitor the multiple interfaces of the SOC. The additional connectivity setup work can be error prone.

It is noted that the SOC is used as an example, and the DUT 101 can be any suitable design, such as a circuit module, a circuit block, an intellectual property (IP) block, an SOC, and the like.

In addition, according to an aspect of the disclosure, the coverage scoreboard 130 is configured to collect coverage based on comparisons of the output responses of the DUT 101 with a reference, such as a reference model, pre-stored reference responses, and the like.

In an example, the DUT 101 generates output signals at the pin level in response to input signals at the pin level in a test. The input signals and output signals are monitored and converted to transaction level input and output signals. The transaction level input and output signals are provided to the coverage scoreboard 130. The coverage scoreboard 130 includes a reference response for the test. When, for example, the output signals at the transaction level match the reference response, the DUT 101 passes the test. When the DUT 101 passes the test, the test is collected into the coverage calculation. Thus, the coverage calculation is based on success of the behavior comparison of the DUT 101 with the reference.

According to an embodiment of the disclosure, comparison failure can be caused by various factors, such as design errors in the DUT 101, incompleteness of the reference, mismatched signal format, and the like. When a comparison failure happens in a test, the test is not collected in the coverage calculation. In an example, the output signals at the transaction level do not match the reference response due to an error in the DUT 101, thus the DUT 101 fails the test. When the DUT 101 fails the test, the test is not collected into the coverage calculation. In another example, the coverage scoreboard 130 does not include a suitable reference response for the test, no comparison is conducted, and thus the test is not collected into the coverage calculation.

Accordingly, the coverage more accurately represents the measure of the design features that have been excited by the test in the verification system 100, and is indicative of the quality and thoroughness of the verification system 100. The coverage can be used to assist bug detection in the DUT 101, and system improvement for the verification system 100.

Further, according to an embodiment of the disclosure, the coverage scoreboard 130 can be implemented using a class inheritance technique to improve code maintenance.

Figure 2:
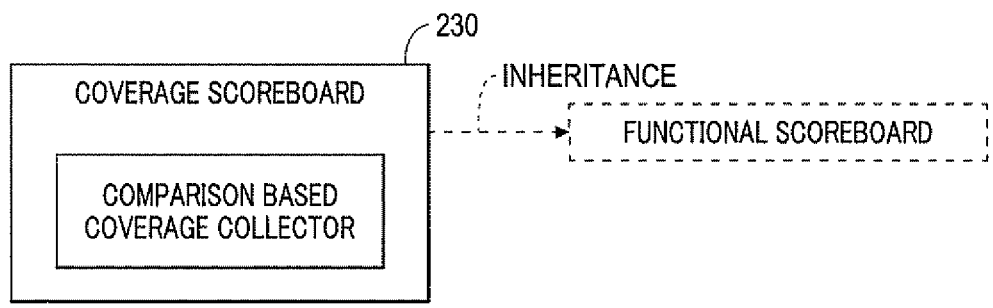
FIG. 2 shows a block diagram of a coverage scoreboard example 230 according to an embodiment of the disclosure.

FIG. 2 shows a block diagram of a coverage scoreboard example 230 according to an embodiment of the disclosure. In an example, the coverage scoreboard 230 is implemented as a class in an object oriented programming language. The coverage scoreboard 230 includes all the features and properties of a functional scoreboard, such as response comparison, and the like.

Further, the coverage scoreboard 230 defines the coverage collecting function that is performed based on the response comparison function, for example.

In the FIG. 2 example, the coverage scoreboard 230 inherits from a functional scoreboard that defines all the functions needed for a functional scoreboard, such that the functions of the functional scoreboard can be kept stable and safe while the coverage collection function is actively modified. In an example, the functional scoreboard is not included in the verification environment, and can be kept safe when changes are made to the verification environment.

According to an aspect of the disclosure, generally, the coverage collection function needs frequent modifications at a final stage of a DUT development, such as just before tape-out. For example, at the final stage of the DUT development, verification is performed iteratively on a daily base. In each new iteration, new tests, such as determined tests to target specific functions of the DUT, test with new constrains to excite corner cases, and the like, can be added to improve verification coverage in order to achieve a coverage goal. Thus, the coverage collection function portion of the coverage scoreboard 230 needs to be modified daily according to the new tests to take the new tests into coverage, and achieve higher coverage in a next iteration.

However, at the final stage of the DUT development, the functions of the functional scoreboard have been developed mature and stable. It is preferred that the functional scoreboard can be kept intact and thus can be time-efficiently used at the final stage of DUT development.

In the FIG. 2 example, the functions of the functional scoreboard are kept in a parent class. The coverage scoreboard 230 inherits the parent class, and thus includes all the features, such as the functions, of the parent class. In addition, the coverage scoreboard 230 includes a coverage collection function portion. Thus, at the final stage of the DUT development, while the coverage collection function portion is frequently modified, the functional scoreboard portion can be kept intact in the parent class to avoid being modified accidentally.

Figure 3:
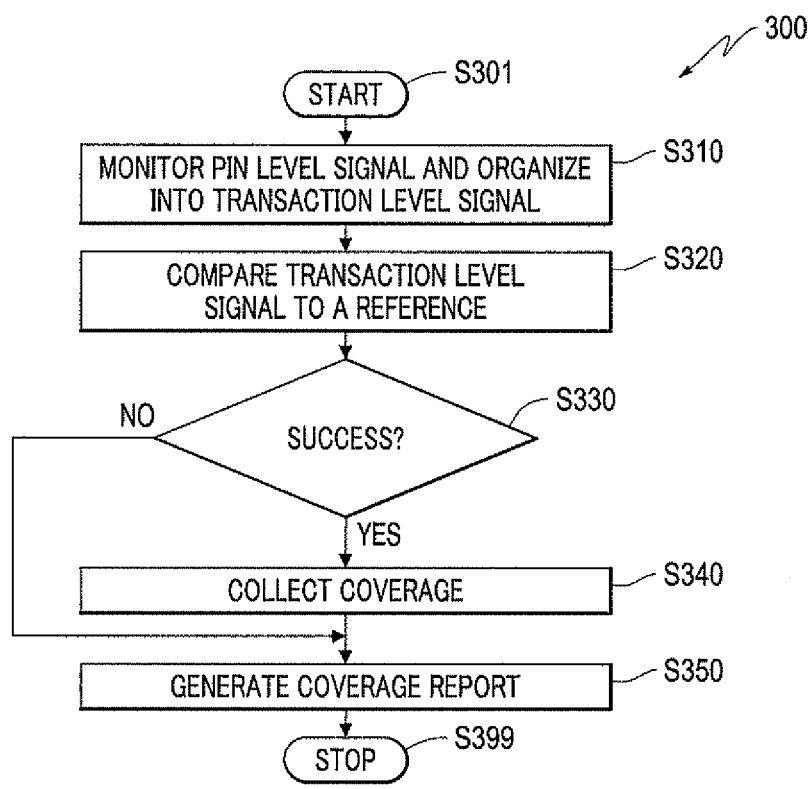
FIG. 3 shows a flow chart outlining a process example 300 according to an embodiment of the disclosure.

FIG. 3 shows a flow chart outlining a process example 300 according to an embodiment of the disclosure. The process 300 can be executed in the verification system 100. The process starts at S301 and proceeds to S310.

At S310, pin level signals in and out of the DUT 101 are monitored and converted into transaction level signals. For example, the master agent 105 drives pin level input signals to the DUT 101 according to a test. The monitor 115 monitors and samples the pin level input signals, and organizes the sampled pin level signals into transaction level input signals. The DUT 101 outputs pin level output signals in response to the pin level input signals. The monitor 120 monitors and samples the pin level output signals, and organizes the sampled pin level signals into transaction level output signals. The transaction level input and output signals can be provide to the coverage scoreboard 130.

At S320, the transaction level output signals are compared with a reference. In an example, the coverage scoreboard 130 includes a reference model at a relatively higher abstraction level than the DUT 101. The reference model can generate a reference response, such as in the form of transaction level signals, in response to the transaction level input signals. Then, the coverage scoreboard 130 compares the reference response with the transaction level output signals from the DUT 101.

At S330, when transaction level output signals match the reference, the comparison succeeds, and the process proceeds to S340; otherwise, the process proceeds to S350.

At S340, the test is collected into a coverage calculation. For example, the transaction level input and output signals are sampled and analyzed to determine portions of the DUT 101, such as codes of the DUT 101, functions of the DUT 101, and the like, that have been excited by the test, which coverage points and coverage group in the coverage goal have been satisfied, and whether coverage holes left from previous iterations have been filled.

At S350, the verification system 100 generates a coverage report. Then, the process proceeds to S399 and terminates.

In the FIG. 3 example, for some reason, such as bugs in the DUT, incompleteness of the reference, and the like, the comparison is not successful, and new tests are not collected into the coverage calculation. When the coverage cannot meet a coverage goal during a time period that the new tests are continuously added, the coverage report can be analyzed to determine the reason why the comparison does not succeed.

FIG. 4 shows a code example 400 of a functional scoreboard. The functional scoreboard is implemented as a class in a Universal Verification Methodology (UVM) framework. The code has been simplified for clarity to show the prototype of the functional scoreboard.

The functional scoreboard uses ports, such analysis ports in UVM, for communicating transaction level signals with other components in the verification system. For example, in lines 5-6, the functional scoreboard declares analysis port. The declaration of the analysis port requires transaction type and current class the analysis port resides in, as parameters. Further, at an environment level, the verification environment can connect ports of the different components to enable transaction level signals to be communicated between the different components. For example, the verification environment can connect the analysis port of the functional scoreboard with a port of a monitor to enable the monitor to provide transaction level signals to the functional scoreboard.

Further, in lines 8-11, the functional scoreboard defines a virtual function for data comparison. The virtual function can be overridden in a child class.

FIG. 5 shows a code example 500 for a coverage scoreboard according to an embodiment of the disclosure. The coverage scoreboard is implemented as a child class of the functional scoreboard shown in FIG. 4 in the UVM framework. The code has been simplified for clarity to show the prototype of the coverage scoreboard.

In line 1, the coverage scoreboard is defined as a child class of the functional scoreboard shown in FIG. 4, thus the coverage scoreboard can inherit all the properties and methods from the functional scoreboard.

In line 3, the type redefinition for current class overrides the type definition in the functional scoreboard, such that the analysis ports are part of the coverage scoreboard.

In line 4, a new variable ahb_cov_inst defines the coverage group and coverage points to be sampled.

In lines 6-10, the coverage scoreboard overrides the data comparison function in the functional scoreboard to do coverage collection. Specifically, in line 7, the analysis ports are passed to the super class from the parent class. In line 8, the transaction level signals from the DUT are received and sampled for the coverage collection purpose. In line 9, the sampled data are analyzed to determine coverage points and coverage group, for example.

It is noted that the codes shown in FIG. 4 and FIG. 5 have been simplified for clarity. The functional scoreboard and the coverage scoreboard can include various necessary functions.

The coverage scoreboard can replace the functional scoreboard in a test environment by various ways. In an embodiment, a test environment directly replaces the functional scoreboard with the coverage scoreboard. In another embodiment, the test environment does not change, and is reusable. A test case that uses the test environment can use a factory override feature to replace the functional scoreboard with the coverage scoreboard.

While aspects of the present disclosure have been described in conjunction with the specific embodiments thereof that are proposed as examples, alternatives, modifications, and variations to the examples may be made. Accordingly, embodiments as set forth herein are intended to be illustrative and not limiting. There are changes that may be made without departing from the scope of the claims set forth below.

What is claimed is:

1. A method, comprising:
   receiving an output response from a design under test (DUT) in response to an input applied to the DUT according to a test;
   comparing, performed by circuitry, the output response with a reference response of the test applied to a reference model to determine a pass/fail of the DUT for the test;
   collecting the test into a verification coverage that tracks design features of the DUT that are excited by the test when the DUT passes the test;
   converting pin level signals in and out of the DUI to transaction level signals; and
   providing the transaction level signals to a class defined in an object oriented programming language via a single port by providing the transaction level signals to the class that defines functions for the coverage collection and inherits functions of a functional scoreboard from a parent class.

2. The method of claim 1, further comprising:
   avoiding collecting the test into the verification coverage without the comparison.

3. The method of claim 1, further comprising:
   avoiding collecting the test into the verification coverage when the comparison does not succeed.

4. The method of claim 1, further comprising:
   receiving the output response from a single port; and
   using the output response received from the single port for both the comparison and the coverage collection.

5. The method of claim 1, further comprising:
   modifying the functions for the coverage collection in the class without affecting the parent class.

6. A verification system comprising a scoreboard component having circuitry that is configured to:
   receive an output response from a design under test (DUT) in response to an input applied to the DUT according to a test;
   compare the output response with a reference response of the test applied to a reference model to determine a pass/fail of the DUT for the test;
   collect the test into a verification coverage that tracks design features of the DUT that are excited by the test when the DUT passes the test; and
   a monitor component configured to convert pin level signals in and out of the DUI to transaction level signals, and provide the transaction level signals to the scoreboard component via a single port, wherein the scoreboard component is implemented as a class defined in an object oriented programming language, the class defines functions for the coverage collection and inherits functions in a functional scoreboard from a parent class.

7. The verification system of claim 6, wherein the scoreboard component is configured to avoid collecting the test into the verification coverage without the comparison.

8. The verification system of claim 6, wherein the scoreboard component is configured to avoid collecting the test into the verification coverage when the comparison does not succeed.

9. The verification system of claim 6, wherein the scoreboard component is configured to receive the output response from a single port, and use the output response received from the single port for both the comparison and the coverage collection.

10. The verification system of claim 6, wherein the class is modified to make changes in the functions for the coverage collection without affecting the functions in the functional scoreboard from the parent class.

11. A non-transitory computer-readable storage medium storing instructions for causing a processor to execute operations for design verification, the operations comprising:
    receiving an output response from a design under test (DUT) in response to an input applied to the DUT according to a test;
    comparing the output response with a reference response of the test applied to a reference model to determine a pass/fail of the DUT for the test;
    collecting the test into a verification coverage that tracks design features of the DUT that are excited by the test when the DUT passes the test;
    converting pin level signals in and out of the DUT to transaction level signals; and
    providing the transaction level signals to a class defined in an object oriented programming language via the single port by providing the transaction level signals to the class that defines functions for the coverage collection and inherits functions in a functional scoreboard from a parent class.

12. The non-transitory computer-readable storage medium of claim 11, wherein the operations further comprises:
    avoiding collecting the test into the verification coverage without the comparison.

13. The non-transitory computer-readable storage medium of claim 11, wherein the operations further comprises:
    avoiding collecting the test into the verification coverage when the comparison does not succeed.

14. The non-transitory computer-readable storage medium of claim 11, wherein the operations further comprises:
    receiving the output response from a single port; and
    using the output response received from the single port for both the comparison and the coverage collection.

* * * * *